(12) United States Patent
Maruyama et al.

(10) Patent No.: US 7,893,473 B2
(45) Date of Patent: Feb. 22, 2011

(54) SEMICONDUCTOR MEMORY DEVICE AND METHOD OF FABRICATING THE SAME

(75) Inventors: Kenji Maruyama, Kawasaki (JP); Masao Kondo, Kawasaki (JP); Keisuke Sato, Matsudo (JP)

(73) Assignee: Fujitsu Limited, Kawasaki (JP)

( * ) Notice: Subject to any disclaimer, the term of this patent is extended or adjusted under 35 U.S.C. 154(b) by 116 days.

(21) Appl. No.: 12/239,892

(22) Filed: Sep. 29, 2008

(65) Prior Publication Data

US 2009/0050949 A1 Feb. 26, 2009

Related U.S. Application Data

(63) Continuation of application No. PCT/JP2006/306496, filed on Mar. 29, 2006.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 21/00* (2006.01)

(52) U.S. Cl. ............... 257/295; 257/326; 257/E27.104; 257/E29.164; 257/E21.663; 438/3

(58) Field of Classification Search ................. 257/295, 257/327, 368, 326, E17.104, E29.164, E21.208, 257/E21.663; 438/3, 287, 288
See application file for complete search history.

(56) References Cited

U.S. PATENT DOCUMENTS 6,067,244 A * 5/2000 Ma et al. ................... 365/145
2002/0025637 A1 * 2/2002 Maeda ........................ 438/299

FOREIGN PATENT DOCUMENTS

JP 2002-170937 A 6/2002
JP 2004-172483 A 6/2004

OTHER PUBLICATIONS

International Search Report of PCT/JP2006/306496, date of mailing date Jun. 27, 2006.
Fujimura, Norifumi; "Multiferroic Zairyo no Sekkei to Device Oyo"; The Japan Society of Applied Physics Kessho Kogaku Bunkakai No. 123 Kai Text, Jul. 22, 2005, pp. 33-40.
Takahashi, Kouhei et al.; "Terahertz radiation by ultrafast spontaneous polarization modulation in Multiferroic BiFeO3 thin films"; Oct. 6, 2005.

* cited by examiner

*Primary Examiner*—Hoai v Pham
(74) *Attorney, Agent, or Firm*—Westerman, Hattori, Daniels & Adrian, LLP

(57) ABSTRACT

The present invention is to provide a semiconductor memory device capable of providing excellent storage properties, scaling and high integration and a method of fabricating the same. A semiconductor memory device has a multiferroic film exhibiting ferroelectricity and ferromagnetism, a channel region on an interface of a semiconductor substrate below the multiferroic film, source and drain regions formed on both sides of the channel region, a gate electrode (data write electrode) applying gate voltage to the multiferroic film to write data in such a way that the orientation of magnetization is changed as corresponding to the orientation of dielectric polarization, and source and drain electrodes (data read electrodes) that read data based on a deviation in a flow of the carrier, the deviation caused by applying the Lorentz force to the carrier flowing in the channel region from a magnetic field occurring in the channel region because of magnetization.

20 Claims, 9 Drawing Sheets

SEMICONDUCTOR MEMORY DEVICE AND METHOD OF FABRICATING THE SAME

CROSS REFERENCE TO RELATED APPLICATIONS

This application is a Continuation of International Application No. PCT/JP2006/306496, with an international filing date of Mar. 29, 2006, which designating the United States of America, the entire contents of which are incorporated herein by reference.

BACKGROUND OF THE INVENTION

1. Field of the Invention

The present invention relates to a semiconductor memory device and a method of fabricating the same.

2. Description of the Related Art

A non-volatile random access memory (RAM) that maintains last data even though a power supply is turned off and allows random access is regarded as a promising device that forms the foundation of the ubiquitous society in the fields of personal identification and security.

Among various non-volatile RAMs, a non-volatile memory (FeRAM) that uses a ferroelectric having spontaneous polarization in the dielectric layer of a capacitor is expected as the next generation memory in the field of mobile devices because its power consumption is small.

Particularly, a one transistor (1T) FeRAM having a structure in which a ferroelectric film is provided on a gate insulating film of a field effect transistor (FET) can be subjected to nondestructive readout, and is characterized in that the cell area can be made smaller. On this account, the 1T FeRAM is advantageous in respects of the number of readouts and higher integration over a one transistor and one capacitor (1T1C) FeRAM and a 2 transistor and 2 capacitor (2T2C) FeRAM subjected to destructive readout.

A typical 1T FeRAM has the FET structure in which a gate insulating film (I), a ferroelectric film (F) and an electrode film (M) are layered on the channel region of a semiconductor substrate (S) having a source region and a drain region formed thereon. The FeRAM having this structure is called an MFIS (a metal layer (Metal), a ferroelectric layer (Ferroelectric), an insulating layer (Insulator), and a semiconductor layer (Semiconductor) FeRAM. In the MFIS FeRAM, the ON-state current value is different from the OFF-state current value in a few digits between the source and the drain depending on the orientation of polarization of the ferroelectric film, and this is used to determine whether to be the "0" state or the "1" state.

For the ferroelectric film, the following is used: $Pb(Zr, Ti)O_3$ having a perovskite structure, or PZT materials in which $Pb(Zr, Ti)O_3$ is added with a dopant such as La, Ca, Sr, or Nb, or $(Bi, La)_4Ti_3O_{12}$ or $SrBi_2Ta_2O_9$ having a bismuth layer structure. The ferroelectrics having the bismuth layer structure have a polarization charge amount as well as a dielectric constant smaller than those of PZT materials. The FET FeRAM operates adequately as long as the polarization charge amount of the ferroelectric film is about 1 $\mu C/cm^2$. Because the ferroelectrics having the bismuth layer structure have a small dielectric constant to which a large voltage can be applied, the ferroelectrics are often used for the ferroelectric layer.

The 1T1C FeRAM is already commercially practical. However, for the 1T1C FeRAM, a single transistor and a single ferroelectric capacitor are required for a single memory cell, and thus a certain size is necessary for the 1T1C FeRAM to form memory cells. The charge amount that can be stored in the ferroelectric capacitor is proportional to the area, and the charge amount necessary for storage cannot be maintained as scale-down is being advanced. In other words, in the 1T1C FeRAM, it is difficult to fabricate a large capacity memory.

On the other hand, the FET FeRAM is capable of conducting nondestructive readout, and advantageous in that the cell area can be made smaller as compared with the 1T1C FeRAM. However, in the current FET FeRAM, write and read voltages are high, and the reliability of the insulating film is poor. Therefore, the FET FeRAM has the retention properties and the imprinting properties indicating the storage performance behind those of the current 1T1C FeRAM. On this account, the FET FeRAM is not commercially available yet.

The Patent Reference 1 (JP-A-2004-172483), in order to exhibit both of ferroelectricity and ferromagnetism, such a semiconductor memory device is disclosed that the semiconductor memory device has a ferroelectric film and a ferromagnetic film formed of separate materials and layered. In this semiconductor memory device, it is necessary to layer the ferroelectric film and the ferromagnetic film in such a way that the electric field occurring in the ferroelectric film and the magnetic field occurring in the ferromagnetic film are affected to each other. In order not to provide the multilayer structure of the ferroelectric film and the ferromagnetic film, such a method is also considered that a ferromagnetic material is mixed with a ferroelectric material for pressure forming. However, in such a method, the properties and reliability of the ferroelectric film and the ferromagnetic film might be impaired.

SUMMARY OF THE INVENTION

An aspect of the invention, a semiconductor memory device includes a multiferroic film that is formed over a semiconductor substrate and has a ferroelectric property and a ferromagnetic property or a ferrimagnetic property; a channel region formed on an interface of the semiconductor substrate below the multiferroic film; a source region and a drain region that are formed on both sides of the channel region; a data write electrode that applies a predetermined voltage to the multiferroic film to write data in such a way that a magnitude or an orientation of magnetization is changed as corresponding to an orientation of dielectric polarization; and a data read electrode that reads the data based on a deviation in a flow of a carrier, the deviation caused by applying a Lorentz force to the carrier flowing in the channel region from a magnetic field occurring in the channel because of the magnetization.

In the semiconductor memory device according to the invention, a gate insulating film is formed between the channel region and the multiferroic film.

DETAILED DESCRIPTION OF THE PREFERRED EMBODIMENTS

First Embodiment

A semiconductor memory device and a method of fabricating the same according to a first embodiment of the invention will be described with reference to FIG. 1 to FIGS. 4A and 4B. The semiconductor memory device 1 according to the embodiment has the structure similar to that of the MFIS FeRAM, which is characterized in that a multiferroic film is used in the ferroelectric film (F). The multiferroic film exhibits ferroelectricity (ferroelectric property) as well as ferromagnetism (ferromagnetic property). The multiferroic film has the property that when one of the electric field and the magnetic field is changed, the other one's characteristic is altered. In the embodiment, such a multiferroic film is used that the orientation of dielectric polarization is nearly orthogonal to the orientation of magnetization.

Figure 1:
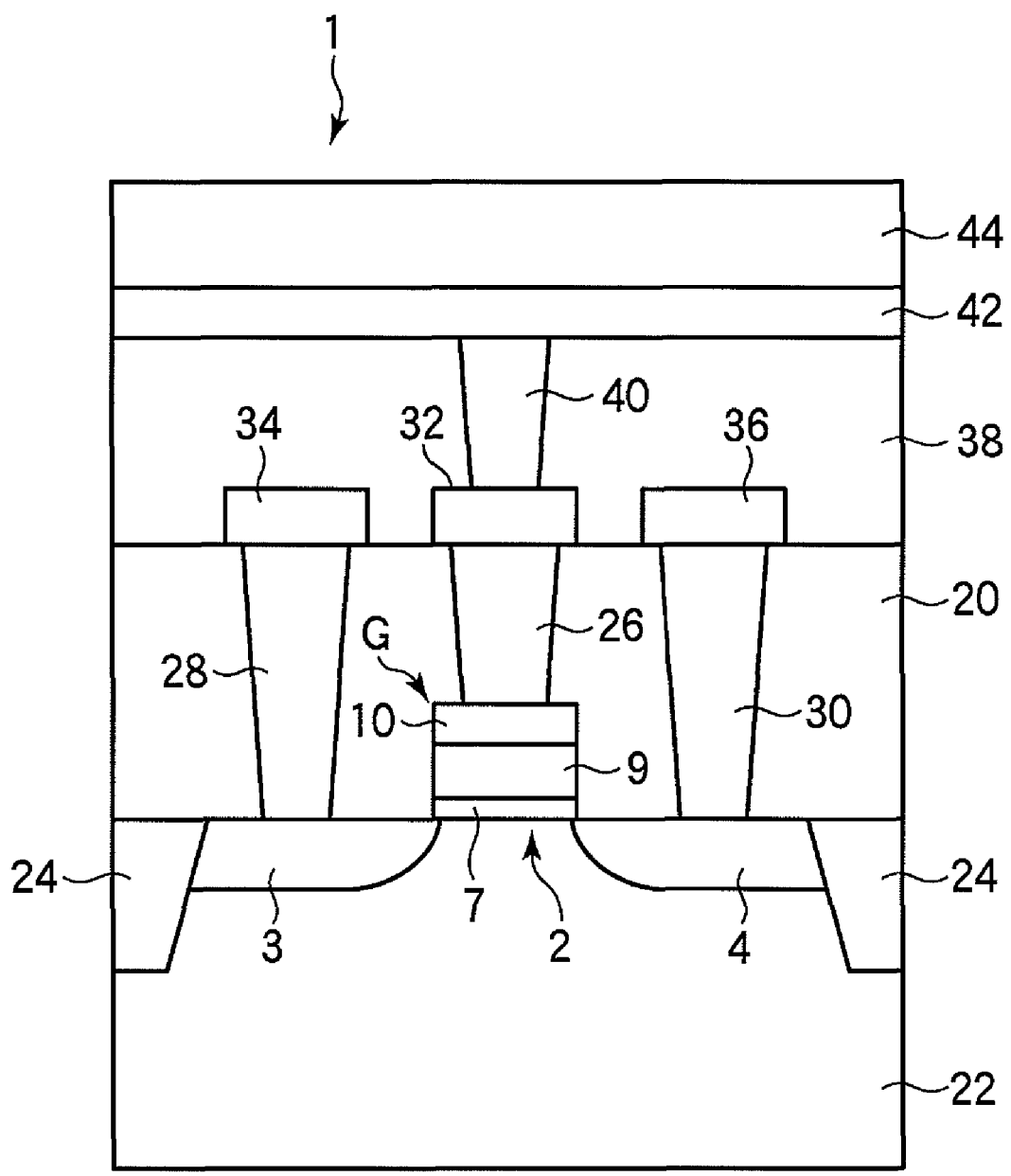
FIG. 1 shows a diagram depicting the structure of a semiconductor memory device 1 according to a first embodiment of the invention.

FIG. 1 shows the cross sectional structure vertical to the substrate surface of the semiconductor memory device 1. As shown in FIG. 1, for example, the semiconductor memory device 1 is formed in the device area defined by a device isolation insulating film 24 formed in a p-type silicon semiconductor substrate 22. A gate G of the semiconductor memory device 1 has a gate insulating film 7 having a film thickness of 5 nm of $HfO_2$ (hafnium oxide) formed on the semiconductor substrate 22, a multiferroic film 9 having a film thickness of 300 nm of BFO ($BiFeO_3$: bismuth iron oxide) formed on the gate insulating film 7, and a gate electrode 10 having a film thickness of 200 nm of Pt (platinum) formed on the multiferroic film 9. The gate insulating film 7 may be formed by depositing another insulating material instead of $HfO_2$ in a film thickness of about 3 to 15 nm. In addition, in the case in which an excellent interface with a small carrier trap level can be obtained, the multiferroic film 9 may be directly formed on the semiconductor substrate 22 without forming the gate insulating film 7.

The front surface area of the semiconductor substrate 22 under the gate insulating film 7 is the channel region 2. On both sides of the channel region 2 as the channel region 2 is in between, a source region 3 and a drain region 4 are formed, which are n-type impurity activation regions. The end portions of the source region 3 and the drain region 4 are extended to under the gate insulating film 7.

As described above, the semiconductor memory device 1 has the structure of an n-channel MFIS FET including the gate G having the gate insulating film 7, the multiferroic film 9, and the gate electrode 10 layered in this order, the channel region 2 under the gate G, and the source and drain regions 3 and 4 formed on both sides of the channel region 2.

A cover film (not shown) of silicon oxynitride (SiON) is formed over throughout the surface of the semiconductor substrate 22, and an interlayer insulating film 20 of silicon dioxide ($SiO_2$) having a thickness of about 1.0 μm is formed thereon, covering the gate insulating film 7, the multiferroic film 9, and the gate electrode 10.

On the source and drain regions 3 and 4 and the gate electrode 10, a tungsten plug is formed in which the interlayer insulating film 20 is opened to form a contact hole and tungsten (W) is buried in the contact hole. The tungsten plug electrically connected to the source region 3 functions as a source electrode 28, the tungsten plug electrically connected to the drain region 4 functions as a drain electrode 30, and the tungsten plug electrically connected to the gate electrode 10 functions as a connecting electrode 26. In addition, a silicide film (not shown) may be formed on each of the front surfaces of the source and drain regions 3 and 4 and the gate electrode 10.

The front surface of the interlayer insulating film 20 is planarized, and the top surfaces of the source electrode 28, the drain electrode 30, and the connecting electrode 26 on the gate electrode 10 are exposed. On the front surface of the interlayer insulating film 20, wirings 32, 34 and 36 are formed. The source electrode 28 is electrically connected to the source wiring 34, the drain electrode 30 is electrically connected to the drain wiring 36, and the connecting electrode 26 on the gate electrode 10 is electrically connected to the connection wiring 32.

On the interlayer insulating film 20, an interlayer insulating film 38 having a thickness burying the wirings 32, 34 and 36 is formed. On the wiring 32, a tungsten plug 40 is formed in which the interlayer insulating film 38 is opened to form a contact hole and tungsten is buried in the contact hole. The front surface of the interlayer insulating film 38 is planarized, and the top surface of the tungsten plug 40 is exposed. On the front surface of the interlayer insulating film 38, a gate wiring 42 is formed, which is extended in the direction intersecting with the wirings 32, 34 and 36, for example. The tungsten plug 40 is electrically connected to the gate wiring 42. On the interlayer insulating film 38, an interlayer insulating film 44 having a thickness burying the gate wiring 42 is formed. The gate electrode 10 is connected to the gate wiring 42 through the connecting electrode 26, the connection wiring 32, and the tungsten plug 40.

The semiconductor memory device 1 according to the embodiment has a data write electrode that applies data write voltage to the multiferroic film 9. In the embodiment, the gate electrode 10 also serves as the data write electrode. To the gate wiring 42, data write voltage corresponding to data to be written generated in a voltage generating part, not shown, is applied. The data write voltage applied to the gate wiring 42 is applied to the gate electrode 10 through the tungsten plug 40, the connection wiring 32, and the connecting electrode 26.

For example, when the positive voltage is applied to the multiferroic film 9 according to the embodiment, the orientation of polarization is aligned in one direction of the film thickness direction as well as the orientation of magnetization is aligned in one direction of the channel width direction of the channel region 2. When the negative voltage is applied to the multiferroic film 9, the orientation of polarization is aligned in the reverse direction of the film thickness direction as well as the orientation of magnetization is aligned in the reverse direction of the channel width direction of the channel region 2. After the orientation of polarization and the orientation of magnetization are fixed, the states of polarization and magnetization are maintained even though the voltage is not applied. Data is written and the data is stored as two types of states of polarization and magnetization maintained correspond to data "1" or data "0".

In the semiconductor memory device 1, data is read by using differences in the conductance values of the channel region 2 between the source and drain regions 3 and 4 as the differences correspond to two types of states of the normal and reverse orientations of polarization and magnetization maintained in the multiferroic film 9. The semiconductor memory device 1 has a data read electrode used for this data read. In the embodiment, the source electrode 28 and the drain electrode 30 also serve as the data read electrode.

In data read, the data read voltage generated in a data detecting part, not shown, is applied between the source drain wirings 34 and 36. The data read voltage applied between the source drain wirings 34 and 36 is applied between the source and drain regions 3 and 4 through the source electrode 28 and the drain electrode 30. The data detecting part, not shown, detects differences in the conductance value of the channel region 2 as changes in the current value carried between the source and drain regions 3 and 4 or changes in the voltage value between the source and drain regions 3 and 4.

Figure 2A:
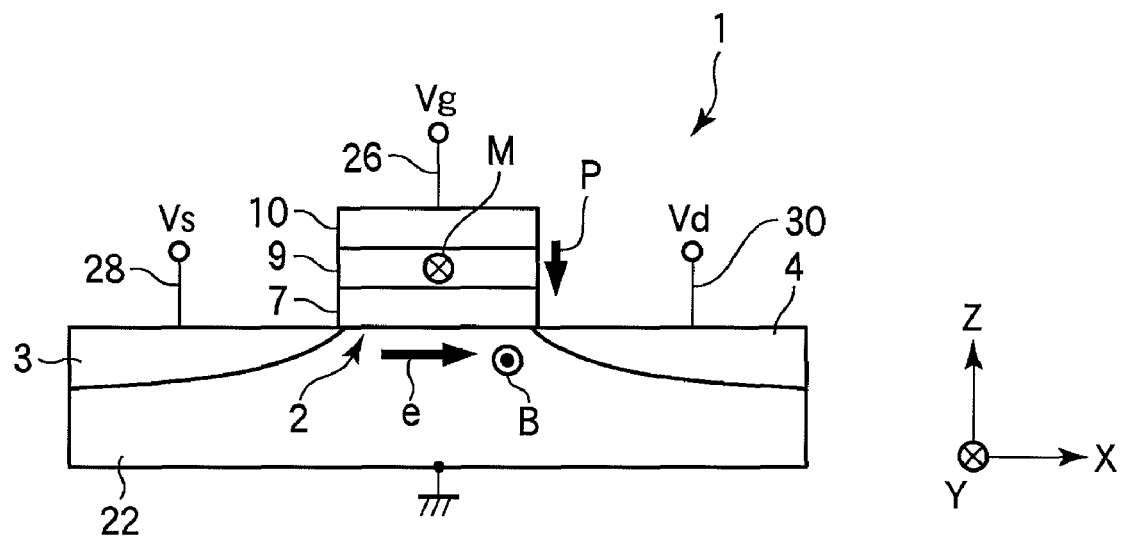
FIGS. 2A and 2B show diagrams illustrative of data write and data read of the semiconductor memory device 1 according to the first embodiment of the invention.
Figure 2B:
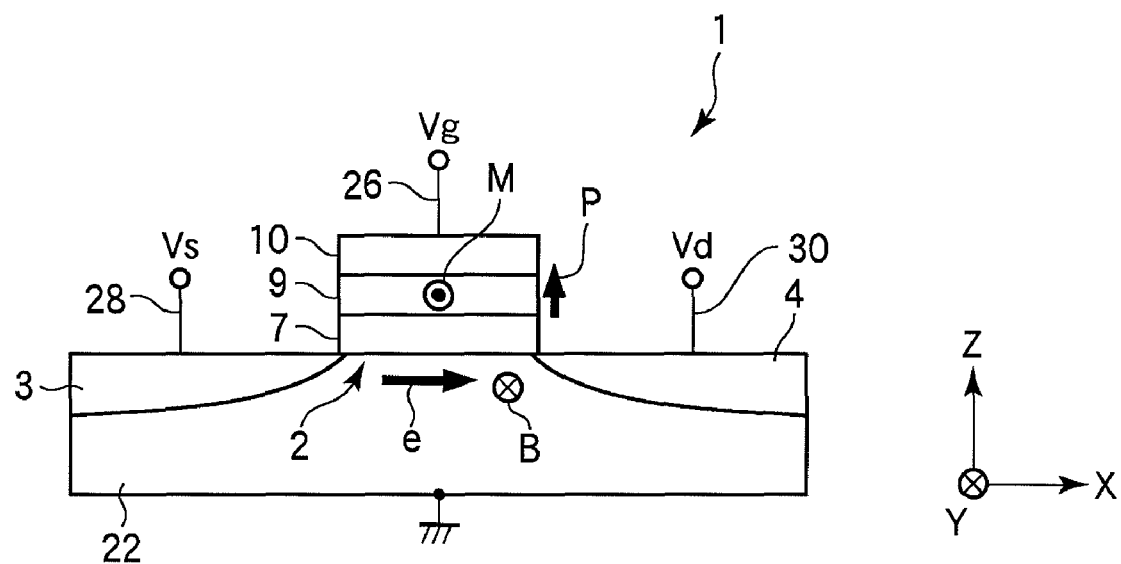

Next, more specific data write and read operations will be described with reference to FIGS. 2A and 2B. FIGS. 2A and 2B schematically show the cross sectional structure vertical to the substrate surface of the semiconductor memory device 1. FIG. 2A shows the write operation of data "1", and FIG. 2B shows the write operation of data "0". For easy understanding, an XYZ rectangular coordinates system is used to provide discussions. In FIGS. 2A and 2B, an XY-plane is taken in parallel with the substrate surface of the semiconductor substrate 22. The X-axis is in parallel with the channel length direction of the channel region 2, and takes the direction from the source region 3 toward the drain region 4 as the normal direction. The Y-axis is in parallel with the channel width direction of the channel region 2, and takes the direction from the front side of the drawing toward the back side as the normal direction. The Z-axis is vertical to the XY-plane, and takes the film layering direction on the semiconductor substrate 22 (the direction from the under side of the drawing to the upper side) as the normal direction.

In the case in which data "1" is written to a semiconductor memory device 1, the semiconductor memory device 1 is selected as well as the write voltage of data "1" (+Vw) for writing data "1" is applied to the gate electrode (data write electrode) 10 as the gate voltage Vg. In addition, in the case in which data "0" is written to a semiconductor memory device 1, the semiconductor memory device 1 is selected as well as the write voltage of data "0" (−Vw) for writing data "0" is applied to the gate electrode 10 as the gate voltage Vg. In addition, in any time of writing data "1" or data "0", the source electrode 28 and the drain electrode 30 are in the open state, and the semiconductor substrate 22 is maintained at the GND (ground) potential, for example.

When the gate voltage Vg=+Vw is applied to the gate electrode 10, as shown in FIG. 2A, dielectric polarization P occurs in the multiferroic film 9 in the negative direction of the Z-axis as well as magnetization M occurs in the normal direction of the Y-axis. This state is maintained even though the voltage application to the gate electrode 10 is released. Accordingly, data "1" is written and stored.

When the gate voltage Vg=−Vw is applied to the gate electrode 10, as shown in FIG. 2B, dielectric polarization P occurs in the multiferroic film 9 in the normal direction of the Z-axis as well as magnetization M occurs in the negative direction of the Y-axis. This state is maintained even though the voltage application to the gate electrode 10 is released. Accordingly, data "0" is written and stored.

Next, the read operation of stored data will be described. First, in order to select a semiconductor memory device 1, the gate voltage Vg=0, for example, is applied to the gate electrode (data write electrode) 10. Then, the source voltage Vs=the GND potential is applied to the source electrode 28, and the data read voltage +Vr is applied to the drain electrode 30 as the drain voltage Vd. These voltage applications may be direct current voltage or pulse voltage.

When data "1" is stored, the dielectric polarization P in the negative direction of the Z-axis occurs in the multiferroic film 9, and the electrons (carrier) in the channel region 2 easily gather in the normal direction of the Z-axis. On this account, because the carrier density of the n-channel (inversion layer) occurring near the interface of the substrate 22 in the channel region 2 increases, the conductance of the channel region 2 is relatively high.

Since the magnetization M in the normal direction of the Y-axis occurs in the multiferroic film 9, a magnetic field B occurs in the channel region 2, the magnetic field B in which magnetic flux lines are extended in the negative direction of the Y-axis. When the data read voltage (+Vr) is applied between the drain and source regions 4 and 3 to carry the current from the drain region 4 toward the source region 3 through the channel region 2, the flow of the electrons e directed from the source region 3 toward the drain region 4 in the channel region 2 is subjected to the Lorentz force directed to the normal direction of the Z-axis due to the magnetic field B, and deviates to the channel side formed near the interface of the substrate 22.

Thus, the conductance of the channel region 2 between the drain and source regions 4 and 3 becomes relatively high. On this account, the current is easily carried between the drain and source regions 4 and 3, and a relatively large source-drain current Ir=I1 is detected.

When data "0" is stored, the dielectric polarization P in the normal direction of the Z-axis occurs in the multiferroic film 9, and the electrons in the channel region 2 hardly gather in the normal direction of the Z-axis. On this account, since the carrier density of the n-channel occurring near the interface of the substrate 22 in the channel region 2 is decreased, the conductance of the channel region 2 is relatively low.

Since the magnetization M in the negative direction of the Y-axis occurs in the multiferroic film 9, a magnetic field B occurs in the channel region 2, the magnetic field B in which magnetic flux lines are extended in the normal direction of the Y-axis. Even though the data read voltage (+Vr) is applied between the drain and source regions 4 and 3 to carry the current from the drain region 4 toward the source region 3 through the channel region 2, the flow of the electrons e directed from the source region 3 toward the drain region 4 in the channel region 2 is subjected to the Lorentz force directed to the negative direction of the Z-axis due to the magnetic field B, and deviates to the deep substrate layer side in the channel region 2. Thus, the conductance of the channel region 2 between the drain and source regions 4 and 3 becomes relatively low. On this account, the current is hardly carried between the drain and source regions 4 and 3, and a relatively small source-drain current Ir=I0<I1 is detected.

As described above, the data read voltage (+Vr) is applied between the drain and source regions 4 and 3 to detect the drain-source current Ir, whereby data can be determined as data "1" when Ir=I1, whereas data can be determined as data "0" when Ir=I0<I1.

Even though no voltage is applied to each of the electrodes 10, 28 and 30 after data read is finished, the orientations of the dielectric polarization P and the magnetization M in the multiferroic film 9 for data storage are not changed. Therefore, since the state of data "0" or data "1" is maintained, nondestructive readout can be conducted to the semiconductor memory device 1 according to in the embodiment.

In the embodiment, the current Ir between the drain and source 4 and 3 is detected for data read. However, instead of this, such a scheme may be possible that changes in the conductance of the channel region 2 are detected as changes in the voltage between the drain and source 4 and 3 for data read.

As discussed above, according to the embodiment, in the semiconductor memory device 1, the switching phenomenon of the magnetization M in association with switching of the dielectric polarization P in the multiferroic film 9 is used to write and read data.

In data storage based only on ferroelectricity as the manner before, variations in the polarization charge amount caused by aging affect the retention properties and the imprinting properties, which become the cause of deterioration in the storage performance of the semiconductor memory device 1.

In contrast to this, in the semiconductor memory device 1 according to the embodiment, since the multiferroic film 9 having the polarity and ferromagnetism is used, data is stored based on polarization as well as magnetization. Because the magnetization properties of the multiferroic film 9 are irrelevant to electrical variations, even though the semiconductor memory device 1 has the 1T structure, the semiconductor memory device 1 according to the embodiment can improve the retention properties and the imprinting properties to enhance the stability of storage properties. Therefore, according to the embodiment, such a semiconductor memory device can be implemented that can provide excellent storage properties, scaling-down and high integration.

Japanese Patent Application No. 2005-026274 proposes a semiconductor device having a controlled film showing ferroelectricity as well as ferromagnetism or ferrimagnetism and a magnetization control structure in which the orientation of magnetization of the controlled film is changed. In the proposed semiconductor device, the voltage is applied to generate dielectric polarization in the controlled film, and these facts are used to record information, the facts that the conductance between the source and the drain is changed depending on the orientation of this dielectric polarization and that the magnetization control structure is used to magnetize the controlled film and the conductance between the source and the drain is changed based on the Lorentz force applied to the injected current from the magnetic field due to the magnetization. Therefore, in the proposed semiconductor device, a data write part requires a voltage generating part that generates the voltage applied to the controlled film and a magnetization control structure that magnetizes the controlled film.

In contrast to this, the semiconductor memory device 1 according to the embodiment does not need a magnetization control structure that magnetizes the multiferroic film 9. On this account, the semiconductor memory device 1 according to the embodiment can significantly simplify the circuit configuration than that of the proposed semiconductor device.

Figure 3A:
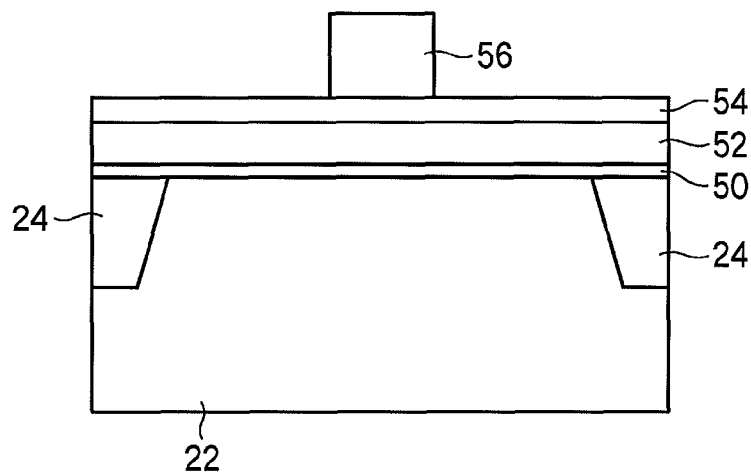
FIGS. 3A to 3C show cross sections depicting the process steps of a method of fabricating the semiconductor memory device 1 according to the first embodiment of the invention (first steps)

Next, a method of fabricating the semiconductor memory device 1 according to the embodiment will be described with reference to cross sections depicting the fabrication process steps shown in FIGS. 3A to 4B. First, as shown in FIG. 3A, STI (Shallow Trench Isolation), or LOCOS (Local Oxidation of Silicon) or the like is used to form the device isolation insulating film 24 in the front surface area of the p-type silicon semiconductor substrate 22.

Subsequently, for example, an electron beam evaporation method is used to form an $HfO_2$ film 50 having a film thickness of 5 nm to be the gate insulating film on the front surface of the semiconductor substrate 22. Then, the semiconductor substrate 22 is placed in a rapid thermal annealing (RTA) furnace to conduct heat treatment at temperatures of 750° C. to 850° C. in the oxidizing atmosphere.

Subsequently, for example, a pulse laser deposition (PLD) method is used to form a BFO ($BiFeO_3$) film 52 having a film thickness of 300 nm to be the multiferroic film on the $HfO_2$ film 50. In the PLD method, first, a BFO ceramics target is placed in a vacuum chamber. The semiconductor substrate 22 having the $HfO_2$ film 50 formed thereon is placed as the substrate faces the target. The substrate temperature is maintained at a temperature of 350° C., and oxygen partial pressure is set to 1.3 Pa. A triple harmonic (a wavelength of 355 nm) of Nd:YAG laser is applied to the target at a 10 Hz repetition frequency, whereby the BFO film 52 having a thickness of 300 nm is deposited on the $HfO_2$ film 50. In addition, instead of $BiFeO_3$, such materials may be used: a material that a dopant of a III group element such as La or Sc is added to $BiFeO_3$, or a dopant of a V group element such as Nb is added thereto, or a material that a dopant is added to $BiNi_xMn_{1-x}O_3$ or $BiNi_xMn_{1-x}O_3$.

BFO bulks are originally ferroelectrics and also antiferromagnetics, and it is known that antiferromagnetics are formed into a thin film to exhibit ferromagnetism. The thin film having BFO as a main component has both properties of ferroelectricity and ferromagnetism. The saturation magnetization of a BFO film 52 prepared according to this method was 90 $emu/cm^3=90/(4\pi \times 10^{-3})$ A/m.

In addition, as the deposition method of the BFO film 52, a CVD (Chemical Vapor Deposition) method, or a Sol gel (Chemical Solution Deposition: CSD) method may be used instead of the PLD method.

Figure 3B:
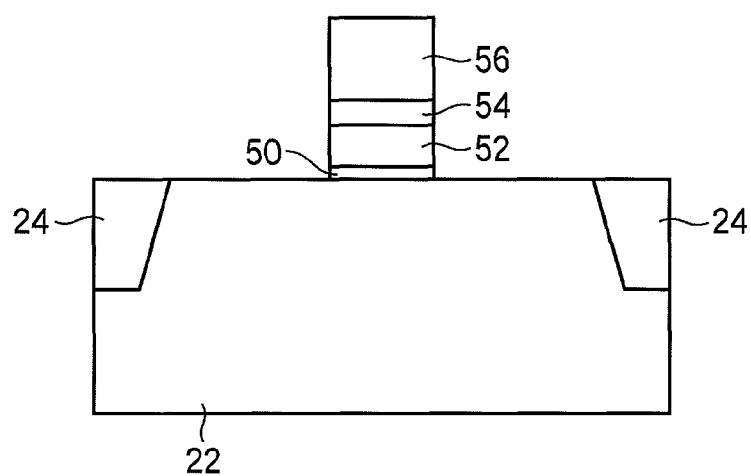
Figure 3C:
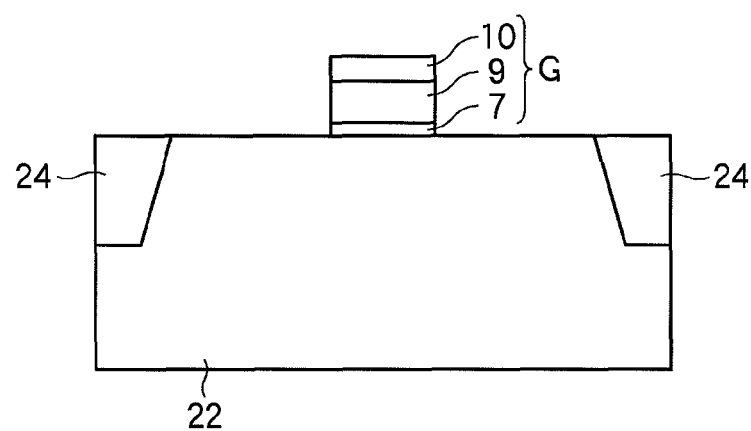

Subsequently, for example, an electron beam evaporation method is used to form a Pt film 54 having a film thickness of 200 nm to be the gate electrode on the BFO film 52. Then, a resist is coated and patterned to form a resist layer 56 on the area for forming the gate. Subsequently, a photolithographic technique is used to pattern three layers from the Pt film 54 to the $HfO_2$ film 50 into a predetermined shape. A mixed gas of argon and chlorine is used as an etching gas, and the resist layer 56 is used as an etching mask to etch the layers on the semiconductor substrate 22. As shown in FIG. 3B, the Pt film 54, the BFO film 52 and the $HfO_2$ film 50 in the exposed area are in turn removed for etching until the semiconductor substrate 22 is exposed. As described above, three layers from the Pt film 54 to the $HfO_2$ film 50 can be collectively etched. Finally, the resist layer 56 used as the etching mask is removed. Thus, as shown in FIG. 3C, the gate G is completed, having the gate insulating film 7 of the $HfO_2$ film, the multiferroic film 9 of the BFO film formed on the gate insulating film 7, and the gate electrode 10 of the Pt film formed on the multiferroic film 9.

Figure 4A:
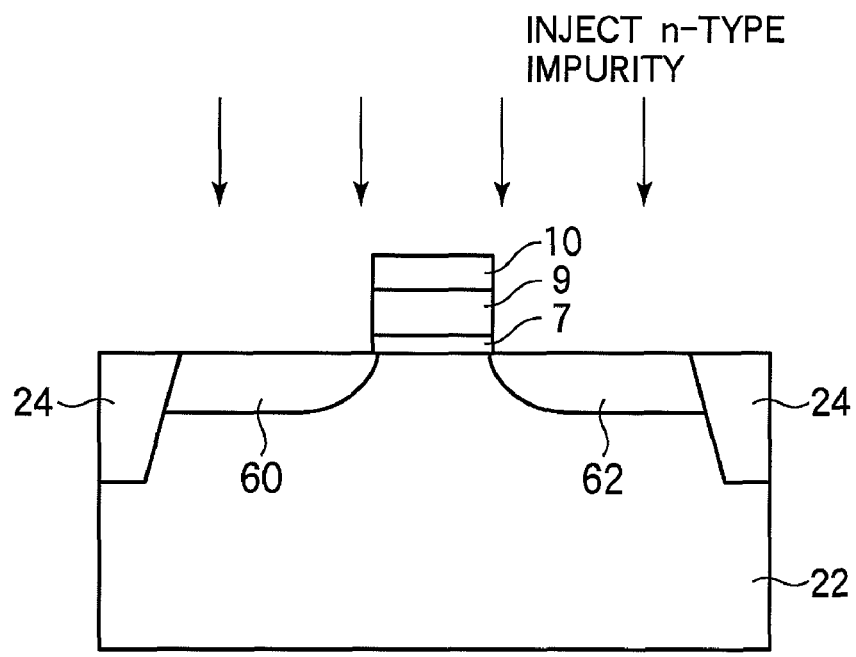
FIGS. 4A and 4B show cross sections depicting the process steps of the method of fabricating the semiconductor memory device 1 according to the first embodiment of the invention (second steps)

Subsequently, as shown in FIG. 4A, with the use of the gate G as a mask, for example, an ion implantation method is used to introduce an n-type impurity such as P (phosphorus) or As (arsenic) into the area in the semiconductor substrate 22 to form n-type impurity regions 60 and 62. For example, the conditions of implanting P are an acceleration energy of 30 keV to 70 keV, a dose of $2 \times 10^{15}$ $cm^{-2}$ to $1 \times 10^{16}$ $cm^{-2}$, and preferably, an acceleration energy 50 keV, and a dose of $5 \times 10^{15}$ cm$^{-2}$ for ion implantation.

Then, a rapid thermal annealing apparatus or the like is used for annealing to activate the implanted impurity. For example, this annealing process is conducted under the conditions of temperatures (temperature rise) from 700° C. to 1000° C., and heating time from 20 sec. to 120 sec. Thus, the n-type impurity regions 60 and 62 shown in FIG. 4A are activated, and as shown in FIG. 4B, the source region 3 and the drain region 4 are formed in the n-type impurity diffusion layer on both sides of the gate G.

Figure 4B:
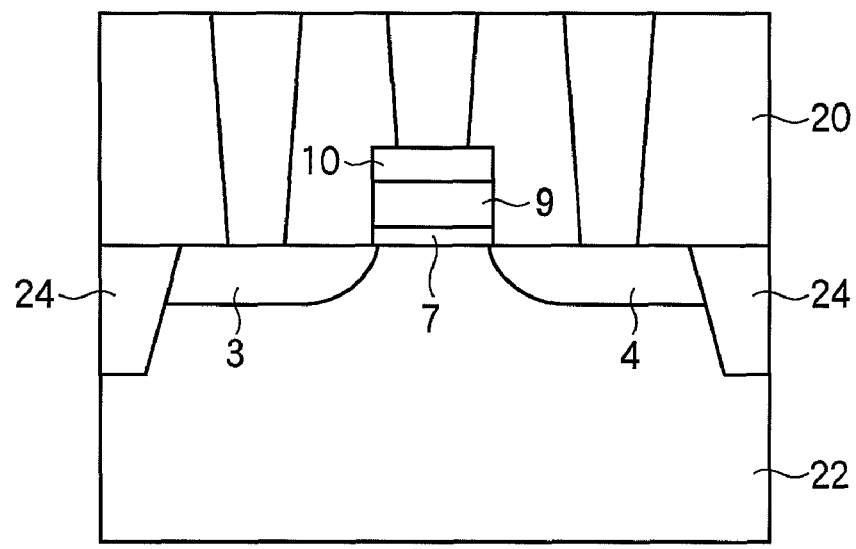

After that, as shown in FIG. 4B, according to a plasma CVD method using a TEOS gas, the interlayer insulating film 20 of silicon dioxide (SiO$_2$) is grown on the cover film to a thickness of about 1.0 μm. Subsequently, the interlayer insulating film 20 is polished according to a chemical mechanical polishing (CMP) method to planarize its surface. Then, contact holes are formed. Subsequently, a Ti film and a Pt film are in turn formed on the interlayer insulating film 20 by a DC sputtering method. In this case, the thickness of the Ti film is formed in about 10 to 30 nm, for example, 20 nm, and the thickness of the Pt film is formed in about 100 to 300 nm, for example, 175 nm. The Ti film serves as a role to improve adhesion between the Pt film and the interlayer insulating film 20.

In addition, an oxide film such as Al$_2$O$_3$, ZrO$_2$ or HfO$_2$ may be formed in a thickness of 50 nm as a protective layer (not shown) between these films by a sputtering method. The protective layer is formed to protect the multiferroic film easily reduced against hydrogen and to block hydrogen from entering the inside of the multiferroic film.

Subsequently, as shown in FIG. 1, the connecting electrode 26, the source electrode 28, and the drain electrode 30 are formed. After the resist layer is removed, RF preprocess etching is conducted to the upper part of the interlayer insulating film 20 and the inner surface of the contact holes, and then a Ti film having a thickness of 20 nm and a TiN (titanium nitride) film having a thickness of 50 nm are formed thereon by sputtering, and these films are an adhesion layer. A tungsten film is formed on the adhesion layer by CVD using a mixed gas of tungsten fluoride (WF$_6$), argon, and hydrogen.

In addition, in the initial stage of growing the tungsten film, a silane (SiH$_4$) gas is also used. The thickness of the tungsten film is about 500 nm, for example, on the interlayer insulating film 20 for fully burying each of the contact holes. In addition, since each of the contact holes is formed in a tapered shape, a cavity (also referred to as a pore, or a void) is hardly formed in the tungsten film buried inside the contact holes.

Subsequently, the tungsten film and the adhesion layer on the interlayer insulating film 20 are removed by CMP, and left only inside each of the contact holes. Thus, the tungsten film and the adhesion layer inside the contact hole are used as the electrodes 26, 28 and 30. Here, when etchback is used instead of CMP, different etching gases are needed for etching the tungsten film and for the adhesion layer, which cause efforts in managing etching.

After that, Al or Cu is used in the direction vertical to the paper surface to form the wirings 32, 34 and 36. The interlayer insulating film 38 is formed, the contact holes are formed, tungsten is buried, the wiring 42 is formed in the direction in parallel with the paper surface, and the interlayer insulating film 44 is formed to bury the wiring 42. These wiring process steps are repeated for a plurality of times depending on the circuit configuration. Through the process steps described above, the semiconductor memory device 1 according to the embodiment having the structure shown in FIG. 1 is completed.

Second Embodiment

Figure 5:
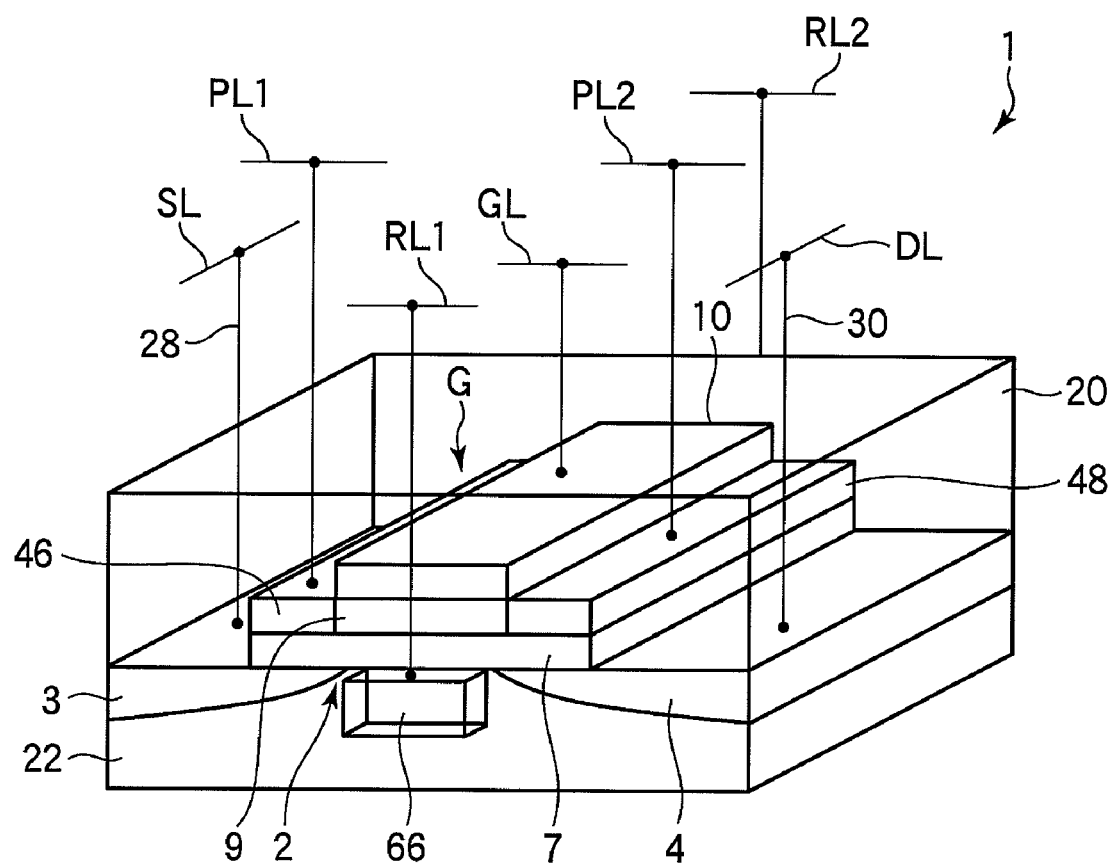
FIG. 5 shows a perspective view schematically depicting the structure of a semiconductor memory device 1 according to a second embodiment of the invention.
Figure 6:
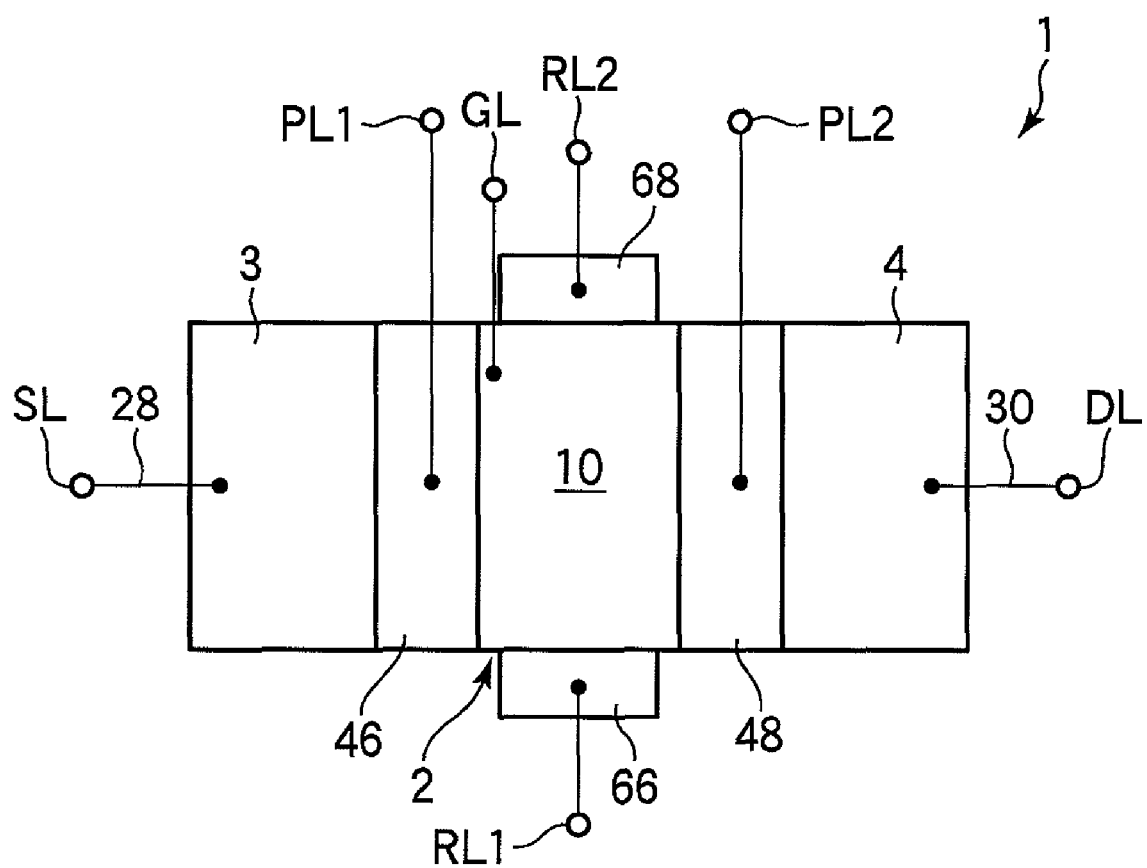
FIG. 6 shows a schematic diagram depicting the semiconductor memory device 1 according to the second embodiment of the invention seen in the normal direction of the substrate surface.

A semiconductor memory device and a method of fabricating the same according to a second embodiment of the invention will be described with reference to FIG. 5 to FIGS. 7A and 7B. A semiconductor memory device 1 according to the embodiment also has the structure similar to the MFIS FeRAM, which is characterized in that a multiferroic film is used for the ferroelectric film (F). First, the schematic configuration of the semiconductor memory device according to the embodiment will be described with reference to FIGS. 5 and 6. FIG. 5 shows a perspective view schematically depicting the structure of the semiconductor memory device 1 according to the embodiment. FIG. 6 shows a schematic diagram depicting the semiconductor memory device 1 shown in FIG. 5 seen in the normal direction of the substrate surface. Among the components of the semiconductor memory device 1 according to the embodiment, the components having functions and operations similar to those of the semiconductor memory device 1 according to the first embodiment are designated the same numerals and signs for omitting the descriptions.

As shown in FIG. 5, in a gate G of the semiconductor memory device 1 according to the embodiment, a gate insulating film 7 is formed as the film extends over source and drain regions 3 and 4 more than the gate G of the first embodiment. On the extending portions of the gate insulating film 7, a pair of data write electrodes (polarization electrodes) 46 and 48 is formed on the source region 3 side and the drain region 4 side as a multiferroic film 9 is in between. The data write electrodes 46 and 48 are formed of Pt having a film thickness of 300 nm, for example, as similar to a gate electrode 10 on the multiferroic film 9.

The data write electrodes 46 and 48 are used to apply the data write voltage that changes the orientation of dielectric polarization of the multiferroic film 9. The data write electrode 46 is connected to a data write wiring PL1. The data write electrode 48 is connected to a data write wiring PL2. In addition, the gate electrode 10 is connected to a gate wiring GL. In addition, one of the data write electrodes 46 and 48 and the gate electrode 10 may be connected in common.

The source region 3 is electrically insulated from the data write electrode 46 by the gate insulating film 7, and connected to a source wiring SL. The drain region 4 is electrically insulated from the data write electrode 48 by the gate insulating film 7, and connected to a drain wiring DL.

In the multiferroic film 9 according to the embodiment, when the positive voltage, for example, is applied between the data write electrodes 46 and 48, the orientation of polarization is aligned in one direction of the channel length direction of a channel region 2 as well as the orientation of magnetization is aligned in one direction of the film thickness direction, whereas when the negative voltage is applied therebetween, the orientation of polarization is aligned in the reverse direction of the channel length direction of the channel region 2 as well as the orientation of magnetization is aligned in the reverse direction of the film thickness direction.

After the orientation of polarization and the orientation of magnetization are fixed, the states of polarization and magnetization are maintained even though the voltage is not applied. Data is written and the data is stored as these two types of states of polarization and magnetization maintained correspond to data "1" or data "0".

In the semiconductor memory device 1, the fact is used to read data, the fact that the Hall voltage in the channel region 2 is varied as corresponding to two types of states of the normal and reverse orientations of polarization and magnetization maintained in the multiferroic film 9.

In the semiconductor memory device 1, for this data read, data read electrodes 66 and 68 are provided that are a pair of n-type impurity activation regions formed in a semiconductor substrate 22 as the channel region 2 is in between in the channel width direction. The data read electrodes 66 and 68 are electrically connected to the channel region 2 at both ends in the channel width direction. The data read electrode 66 is connected to a data read wiring RL1. The data read electrode 68 is connected to a data read wiring RL2. In the state in which a channel (inversion layer) is not formed in the channel region 2, the data read electrodes 66 and 68 and the source and drain regions 3 and 4 can be regarded as they are in the insulating state from each other. In addition, the gate G, the source and drain regions 3 and 4, the data write electrodes 46 and 48, and the data read electrodes 66 and 68 are buried in an interlayer insulating film 20.

In data read, the data read voltage is applied to a source electrode 28 and a drain electrode 30 through the source and drain wirings SL and DL. To the data read electrodes 66 and 68, the Hall voltage is read, which is generated because of uneven distribution of the carrier based on the Lorentz force applied to the carrier in the channel region 2. The read voltage is outputted through the read wirings RL1 and RL2, and the polarity of the Hall voltage is detected to determine stored data.

Figure 7A:
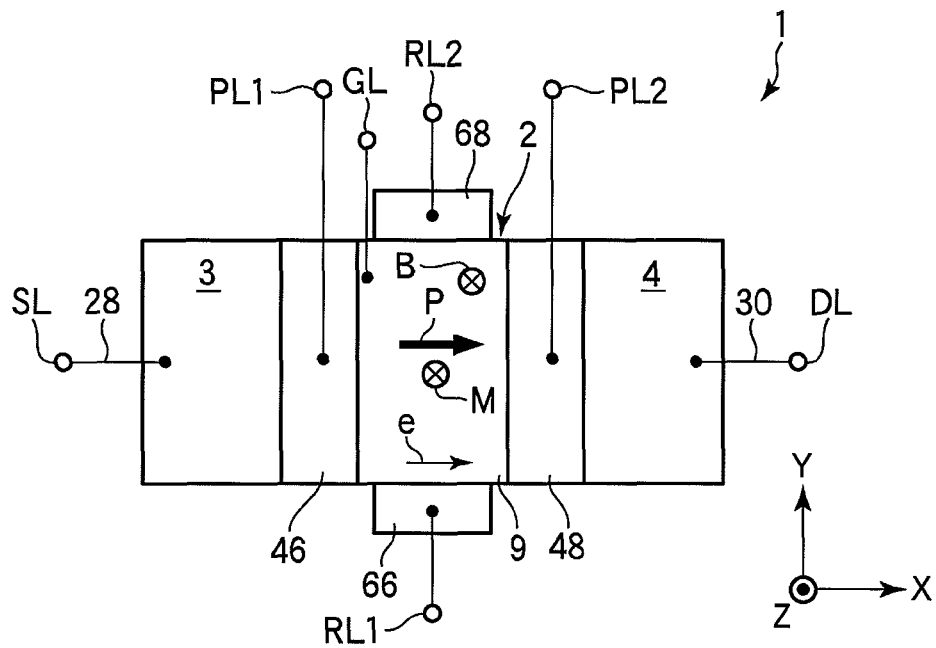
FIGS. 7A and 7B show diagrams illustrative of data write and data read of the semiconductor memory device 1 according to the second embodiment of the invention.
Figure 7B:
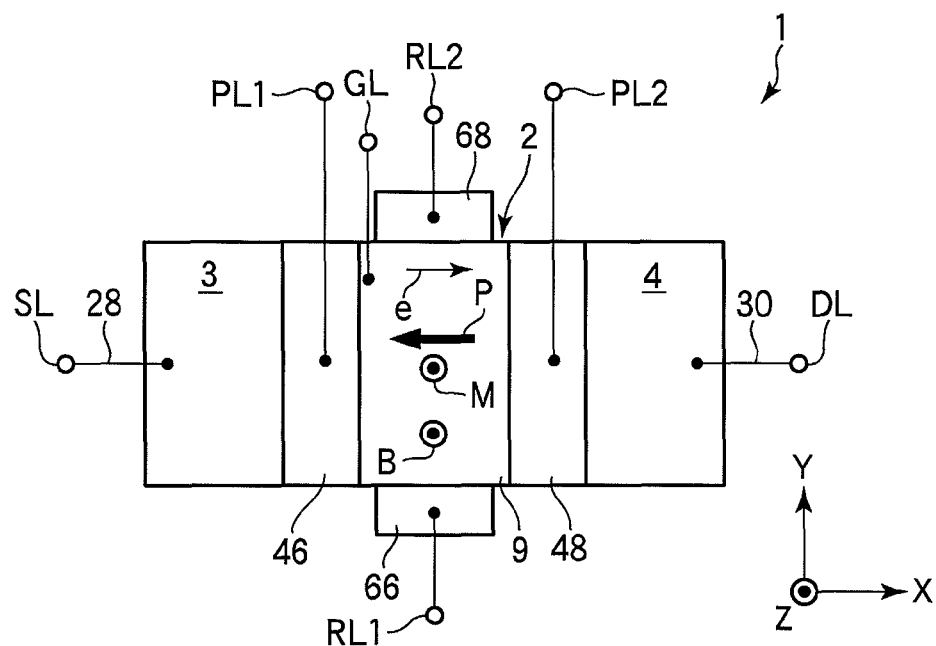

Next, more specific data write and read operations will be described with reference to FIGS. 7A and 7B. FIGS. 7A and 7B show schematic diagrams depicting the semiconductor memory device 1 seen in the normal direction of the substrate surface. FIG. 7A shows the data write operation of data "1", and FIG. 7B shows the write operation of data "0". For easy understanding, an XYZ rectangular coordinates system is used to provide discussions. In FIGS. 7A and 7B, an XY-plane is taken in parallel with the substrate surface of the semiconductor substrate 22. The X-axis is in parallel with the channel length direction of the channel region 2, and takes the direction from the source region 3 toward the drain region 4 as the normal direction. The Y-axis is in parallel with the channel width direction of the channel region 2, and takes the direction from the data read electrode 66 toward the data read electrode 68 (the direction from the under side of the drawing to the upper side) as the normal direction. The Z-axis is vertical to the XY-plane, and takes the direction from the paper surface toward the front of the paper surface in the drawing as the normal direction.

In the case of data write, first, the voltage Vs that selects a semiconductor memory device 1 is applied from the gate wiring GL to the gate electrode 10. In order to write data "1" to the selected semiconductor memory device 1, the write voltage of data "1" (+Vw) is applied between the data write electrodes 46 and 48 from the data write wirings PL1 and PL2.

In addition, in order to write data "0", the write voltage of data "0" (−Vw) is applied between the data write electrodes 46 and 48. In addition, in any time of writing data "1" or data "0", the source electrode 28 and the drain electrode 30 are in the open state, and the semiconductor substrate 22 is maintained at the GND (ground) potential, for example.

When the write voltage of data "1" (+Vw) is applied between the data write electrodes 46 and 48, as shown in FIG. 7A, in the multiferroic film 9, dielectric polarization P occurs in the normal direction of the X-axis as well as magnetization M occurs in the negative direction of the Z-axis. This state is maintained even though the voltage application between the data write electrodes 46 and 48 is released. Accordingly, data "1" is written and stored.

When the write voltage of data "0" (−Vw) is applied between the data write electrodes 46 and 48, as shown in FIG. 7B, in the multiferroic film 9, dielectric polarization P occurs in the negative direction of the X-axis as well as magnetization M occurs in the normal direction of the Z-axis. This state is maintained even though the voltage application between the data write electrodes 46 and 48 is released. Accordingly, data "0" is written and stored.

Next, the read operation of stored data will be described. First, in order to select a semiconductor memory device 1, a predetermined gate voltage Vg is applied to the gate electrode 10 through the gate wiring GL. Subsequently, the data read voltage (+Vr) is applied between the drain and source regions 4 and 3 through the drain and source wirings DL and SL. In addition, in data read, the data write electrodes 46 and 48 are in the open state, and the semiconductor substrate 22 is maintained at the GND (ground) potential, for example.

When data "1" is stored, because the magnetization M in the negative direction of the Z-axis occurs in the multiferroic film 9, a magnetic field B occurs in the channel region 2, the magnetic field B in which magnetic flux lines are extended in the negative direction of the Z-axis. When the data read voltage (+Vr) is applied between the drain and source regions 4 and 3 to carry the current from the drain region 4 toward the source region 3 through the channel region 2, the flow of the electrons e directed from the source region 3 toward the drain region 4 in the n-channel that occurs near the interface of the substrate 22 in the channel region 2 is subjected to the Lorentz force directed to the negative direction of the Y-axis due to the magnetic field B, and deviates to the data read electrode 66 side.

Thus, the channel region 2 on the data read electrode 66 side is negatively (−) charged. On the other hand, the channel region 2 on the data read electrode 68 side is positively (+) charged because the electrons e are short. On this account, the Hall voltage due to the Hall effect appears between the data read electrodes 66 and 68. Then, the potentials outputted from the data read electrodes 66 and 68 are detected to find the voltage $\Delta V = -Vo$ between the data read electrodes 66 and 68 to determine data "1".

When data "0" is stored, because the magnetization M in the normal direction of the Z-axis occurs in the multiferroic film 9, a magnetic field B occurs in the channel region 2, the magnetic field B in which magnetic flux lines are extended in the normal direction of the Z-axis. When the data read voltage (+Vr) is applied between the drain and source regions 4 and 3 to carry the current from the drain region 4 toward the source region 3 through the channel region 2, the flow of the electrons e directed from the source region 3 toward the drain region 4 in the n-channel in the channel region 2 is subjected to the Lorentz force directed to the normal direction of the Y-axis due to the magnetic field B, and deviates to the data read electrode 68 side.

Thus, the channel region 2 on the data read electrode 68 side is negatively (−) charged. On the other hand, the channel region 2 on the data read electrode 66 side is positively (+) charged because the electrons e are short. On this account, the Hall voltage having the polarity opposite to the case of data "1" appears between the data read electrodes 66 and 68. Then, the potentials outputted from the data read electrodes 66 and 68 are detected to find the voltage $\Delta V = +Vo$ between the data read electrodes 66 and 68 to determine data "0".

As described above, the polarity of the voltage $\Delta V$ between the data read electrodes 66 and 68 of the semiconductor memory device 1 is varied depending on data that is stored as the orientation of the magnetization M in the multiferroic film 9. Therefore, in the semiconductor memory device 1, the polarity (positive or negative polarity) of the voltage ΔV is determined to read data "1" or data "0".

After data read is finished, because the orientation of the magnetization M of the multiferroic film 9 for data storage is not changed even though voltages to the wirings PL1, PL2, SL and DL are not applied, data "1" or data "0" can be continuously stored. Therefore, nondestructive readout can be conducted to the semiconductor memory device 1 according to the embodiment.

Here, an exemplary operating condition of the semiconductor memory device 1 is shown. The Hall voltage can be expressed by the following equation:

$$Vy = w \times Jy \times B \div (n \times e) \quad (1)$$

In Equation (1), Vy is the Hall voltage, w is the distance between the voltage measuring terminals, Jy is the Hall current, B is the magnitude of the magnetic field, n is the carrier concentration of the semiconductor layer (the channel region), and e is the charge amount of electrons. As a first example, assuming that w=2 (μm), Jy=0.1 (mA), B=1 (Wb/m$^2$), n=10$^{+14}$ (cm$^{-3}$), and e=1.6×10$^{-19}$ (C), and these values are substituted into Equation (1), and then Vy=1.25×10$^{-11}$ (V), that is, 0.125 (pV).

As a second example, assuming that w=2 (μm), Jy=1 (mA), B=0.1 (Wb/m$^2$)=90 (emu/cm$^3$), n=10$^{+16}$ (cm$^{-3}$) and e=1.6×10$^{-19}$ (C), and these values are substituted into Equation (1), and then Vy=1.25×10$^{-13}$ (V), that is, 0.00125 (pV).

Next, a method of fabricating the semiconductor memory device 1 according to the embodiment will be briefly described. The fabricating method according to the embodiment is almost the same as that of the first embodiment, and only the process steps having differences will be simply described. The data read electrodes 66 and 68 are formed at the same time of forming the source and drain regions 3 and 4. A mask layer is patterned also for the data read electrodes 66 and 68, and a predetermined area of the semiconductor substrate 22 is exposed to conduct n-type impurity implantation and annealing for forming the data read electrodes 66 and 68. Thus, the source and drain regions 3 and 4 and the data read electrodes 66 and 68 are formed on the front surface area of the semiconductor substrate 22.

Next, the formation of the data write electrodes 46 and 48 will be described. First, the HfO$_2$ film to be the gate insulating film is formed over throughout the surface of the semiconductor substrate 22. Subsequently, a BFO film is formed and patterned on the HfO$_2$ film to form the multiferroic film 9. Subsequently, a Pt film to be the gate electrode and the data write electrode is deposited and patterned to form the gate electrode 10 and the data write electrodes 46 and 48.

As discussed above, according to the embodiment, in the semiconductor memory device 1, the multiferroic film 9 showing ferroelectricity as well as ferromagnetism is used to store data that is written with the electric field by the magnetic field. Because the magnetization properties of the multiferroic film 9 is irrelevant to electrical variations, the multiferroic film 9 is excellent in the stability of storage properties, and the storage performance (the retention properties and the imprinting properties) of the semiconductor memory device 1 having the 1T structure can be improved. Therefore, the semiconductor memory device 1 has excellent storage properties to allow scaling-down and high integration.

Third Embodiment

Figure 8:
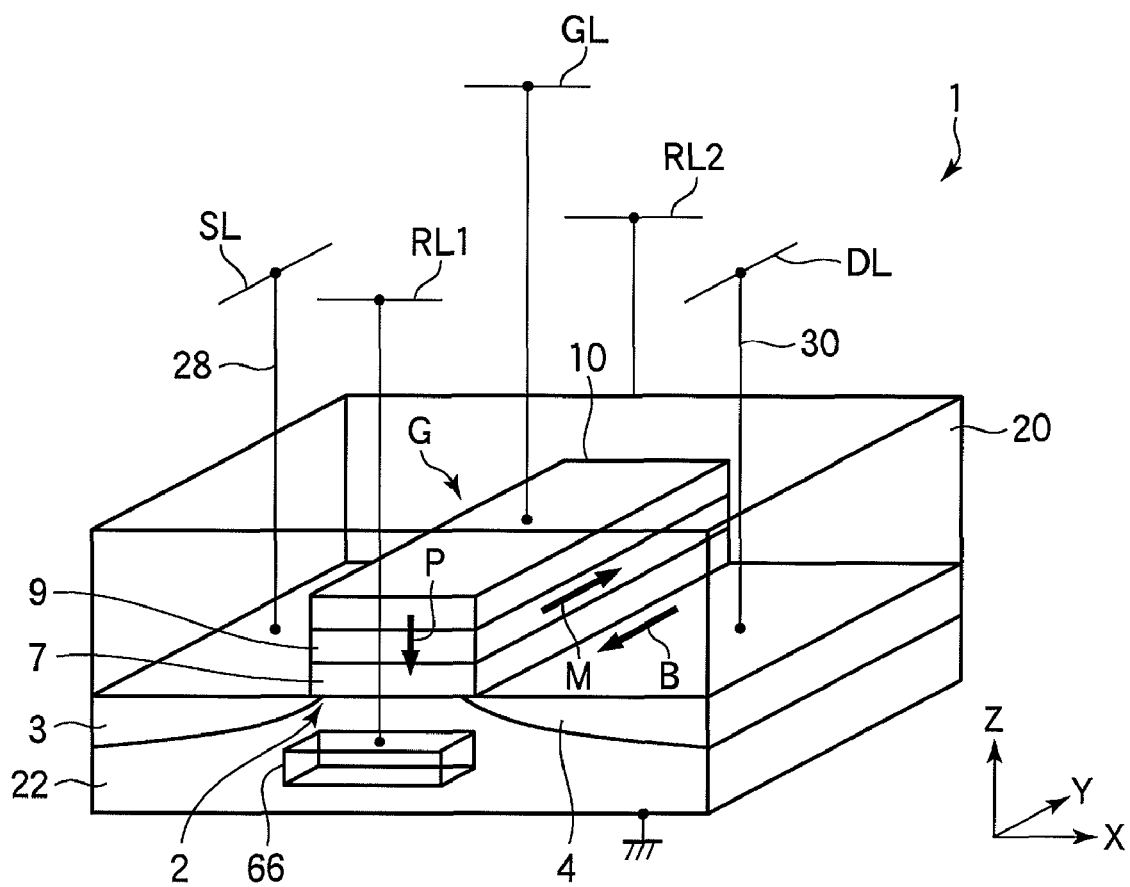
FIG. 8 shows a perspective view schematically depicting the structure of a semiconductor memory device 1 according to a third embodiment of the invention.
Figure 9:
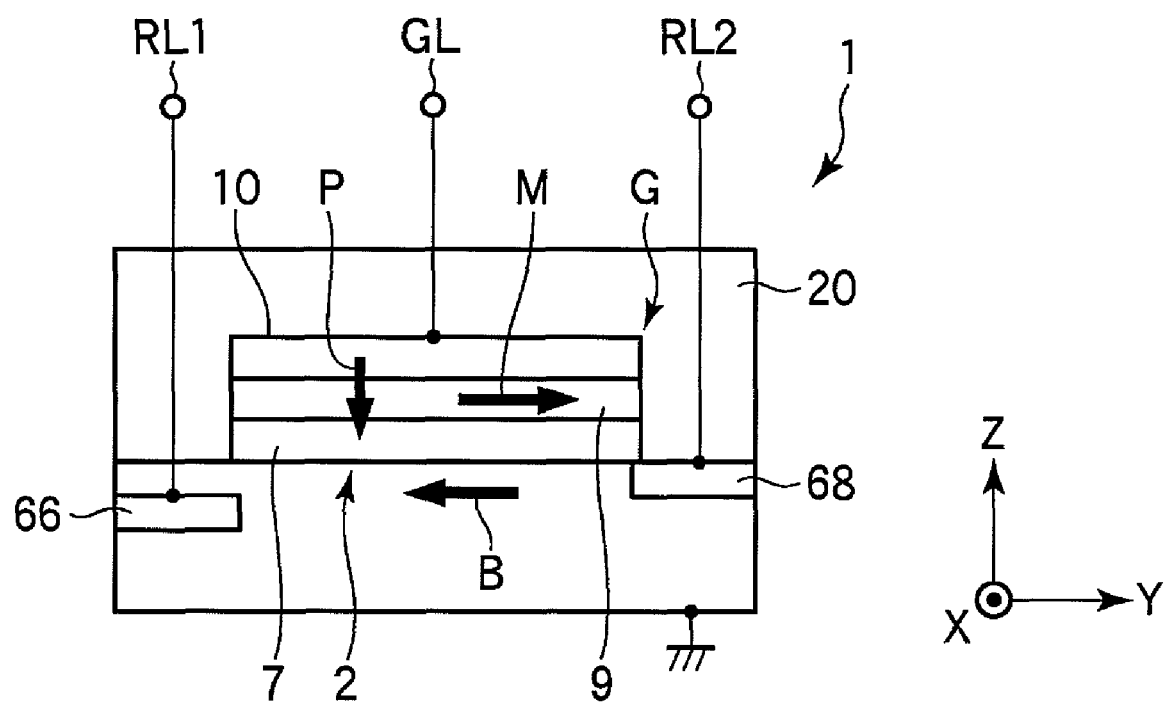
FIG. 9 shows a schematic diagram of a cross section depicting a channel region 2 of the semiconductor memory device 1 according to the third embodiment of the invention cut in the direction in parallel with the channel width.

A semiconductor memory device and a method of fabricating the same according to a third embodiment of the invention will be described with reference to FIGS. 8 and 9. A semiconductor memory device 1 according to the embodiment also has the structure similar to the MFIS FeRAM, which is characterized in that a multiferroic film is used for the ferroelectric film (F). FIG. 8 shows a perspective view schematically depicting the structure of the semiconductor memory device 1 according to the embodiment. FIG. 9 shows a schematic diagram depicting a cross section of a channel region 2 of the semiconductor memory device 1 shown in FIG. 8 cut in the direction in parallel with the channel width.

For easy understanding, an XYZ rectangular coordinates system is used to provide discussions. In FIGS. 8 and 9, an XY-plane is taken in parallel with the substrate surface of a semiconductor substrate 22. The X-axis is in parallel with the channel length direction of the channel region 2, and takes the direction from the source region 3 toward the drain region 4 as the normal direction. The Y-axis is in parallel with the channel width direction of the channel region 2, and takes the direction from the data read electrode 66 toward the data read electrode 68 as the normal direction. The Z-axis is vertical to the XY-plane, and takes the direction from the lower part toward the upper part of the drawing as the normal direction. Among the components of the semiconductor memory device 1 according to the embodiment, the components having functions and operations similar to those of the semiconductor memory device 1 according to the first and second embodiments are designated the same numerals and signs for omitting the descriptions.

As shown in FIGS. 8 and 9, the semiconductor memory device 1 according to the embodiment is characterized in that the data read electrodes 66 and 68 shown in the second embodiment are provided in the same device structure as that of the first embodiment. A data read electrode 66 according to the embodiment is characterized in that the data read electrode 66 is formed deeper in the thickness direction of the semiconductor substrate 22 than a data read electrode 68.

Next, more specific data write and read operations will be described. In the case in which data "1" is written to a semiconductor memory device 1, the semiconductor memory device 1 is selected as well as the write voltage of data "1" (+Vw) to write data "1" is applied to a gate electrode (data write electrode) 10 as the gate voltage Vg. In addition, in the case in which data "0" is written to a semiconductor memory device 1, the semiconductor memory device 1 is selected as well as the write voltage of data "0" (−Vw) to write data "0" is applied to the gate electrode 10 as the gate voltage Vg. In addition, at any time of writing data "1" or data "0", a source electrode 28 and a drain electrode 30 are in the open state, and the semiconductor substrate 22 is maintained to the GND (ground) potential, for example.

When the gate voltage Vg=+Vw is applied to the gate electrode 10, as indicated by an arrow P shown in FIGS. 8 and 9, in the multiferroic film 9, dielectric polarization P occurs in the negative direction of the Z-axis as well as magnetization M occurs in the normal direction of the Y-axis. This state is maintained even though the voltage application to the gate electrode 10 is released. Accordingly, data "1" is written and stored.

When the gate voltage Vg=−Vw is applied to the gate electrode 10, in the multiferroic film 9, dielectric polarization P occurs in the normal direction of the Z-axis in the orientation opposite to the arrow P as well as magnetization M occurs in the negative direction of the Y-axis in the orientation opposite to an arrow M. This state is maintained even though the voltage application to the gate electrode 10 is released. Accordingly, data "0" is written and stored.

Next, the read operation of stored data will be described. First, in order to select a semiconductor memory device 1, a predetermined gate voltage Vg is applied to the gate electrode 10 through the gate wiring GL. Subsequently, the data read voltage (+Vr) is applied between the drain and source regions 4 and 3 through the drain and source wirings DL and SL. In addition, the semiconductor substrate 22 is maintained at the GND (ground) potential, for example.

When data "1" is stored, because the magnetization M in the normal direction of the Y-axis occurs in the multiferroic film 9, a magnetic field B occurs in the channel region 2, the magnetic field B in which magnetic flux lines are extended in the negative direction of the Y-axis. When the data read voltage (+Vr) is applied between the drain and source regions 4 and 3 to carry the current from the drain region 4 toward the source region 3 through the channel region 2, the flow of the electrons e directed from the source region 3 toward the drain region 4 in the n-channel that occurs near the interface of the substrate 22 in the channel region 2 receives the Lorentz force directed to the normal direction of the Z-axis due to the magnetic field B, comes closer to the front surface area of the semiconductor substrate 22, and gathers in the XY plane including the data read electrode 68.

Thus, the channel region 2 in the plane is negatively (−) charged. On the other hand, the channel region 2 in the deep semiconductor substrate 22 is positively (+) charged because electrons are short. The electrons in the channel region 2 are unevenly distributed in such a way that the carrier density becomes smaller toward the negative direction of the Z-axis. The Hall voltage having potential on the data read electrode 68 side being lower than that on the data read electrode 66 side appears in the channel region 2 between the data read electrodes 66 and 68 because of the Hall effect. Then, the potentials outputted from the data read electrodes 66 and 68 are detected to find the voltage $\Delta V=+Vo$ between the data read electrodes 66 and 68 to determine data "1".

When data "0" is stored, because the magnetization M in the negative direction of the Y-axis occurs in the multiferroic film 9, a magnetic field B occurs in the channel region 2, the magnetic field B in which magnetic flux lines are extended in the normal direction of the Y-axis. When the data read voltage (+Vr) is applied between the drain and source regions 4 and 3 to carry the current from the drain region 4 toward the source region 3 through the channel region 2, the flow of the electrons e directed from the source region 3 toward the drain region 4 in the n-channel that occurs near the interface of the substrate 22 in the channel region 2 receives the Lorentz force directed to the negative direction of the Z-axis due to the magnetic field B, moves away from the front surface area of the semiconductor substrate 22, and gathers in the XY plane including the data read electrode 66.

Thus, the channel region 2 in the plane is negatively (−) charged. On the other hand, the channel region 2 in the front surface area of the semiconductor substrate 22 is positively (+) charged because the electrons are short. The electrons in the channel region 2 are unevenly distributed in such a way that the carrier density becomes smaller toward the normal direction of the Z-axis. The Hall voltage having potential on the data read electrode 66 lower than that on the data read electrode 68 side appears in the channel region 2 between the data read electrodes 66 and 68 because of the Hall effect. Then, the potentials outputted from the data read electrodes 66 and 68 are detected to find the voltage $\Delta V=-Vo$ between the data read electrodes 66 and 68 to determine data "0".

As described above, the polarity of the voltage $\Delta V$ between the data read electrodes 66 and 68 of the semiconductor memory device 1 is varied depending on data that is stored as the orientation of the magnetization M in the multiferroic film 9. Therefore, in the semiconductor memory device 1, the polarity (positive or negative polarity) of the voltage $\Delta V$ is determined to read data "1" or data "0".

After data read is finished, because the orientation of the magnetization M of the multiferroic film 9 for data storage is not changed even though no voltage is applied to the wiring GL, SL, and DL, data "1" or data "0" can be continuously stored. Therefore, nondestructive readout can be conducted to the semiconductor memory device 1 according to the embodiment.

Next, the method of fabricating the semiconductor memory device 1 according to the embodiment will be briefly described. The fabricating method according to the embodiment is almost the same as that of the first and second embodiments, and only the process steps having differences will be simply described. The data read electrode 68 is formed at the same time of forming the source and drain regions 3 and 4. A mask layer is patterned also for the data read electrode 68, and a predetermined area of the semiconductor substrate 22 is exposed to implant the n-type impurity. On the other hand, the conditions for the impurity implantation are changed to implant an n-type impurity into the position in the substrate depth direction deeper than the data read electrode 68. Subsequently, an annealing process is applied to form the data read electrodes 66 and 68 in the depths different in the source and drain regions 3 and 4 and in the plate thickness direction on the semiconductor substrate 22.

As discussed above, according to the embodiments, in the semiconductor memory device 1, the multiferroic film 9 showing ferroelectricity as well as ferromagnetism is used to store data that is written with the electric field by the magnetic field. When current is carried between the source region 3 and the drain region 4, the Hall voltage occurs in the channel region 2 due to the Hall effect based on the magnetic field generated by the magnetization M of the multiferroic film 9. Data stored in the semiconductor memory device 1 can be read depending on the polarity (positive or negative polarity) of the Hall voltage. Therefore, the semiconductor memory device 1 according to the embodiment can exert the same advantages as those of the semiconductor memory device 1 according to the second embodiment.

The invention can be modified variously, not limited to the embodiments.

In the first to third embodiments, the material for forming the multiferroic film 9 is the BFO film showing ferroelectricity as well as ferromagnetism. However, the invention is not limited thereto. For example, even though the multiferroic film 9 is formed of a material showing ferroelectricity as well as ferrimagnetism, the same advantages as those of the first to third embodiments can be obtained.

In addition, in order to suppress an increase in the leak current of the multiferroic film 9, a dopant may be added in the case in which the multiferroic film 9 is formed of BFO. A rare earth element, preferably La or Nd is added as a dopant to suppress an increase in the leak current of the multiferroic film 9. When a rare earth element such as La or Nd is added, Bi is partially substituted by La or Nd. Preferably, x is 0.3 or below in order to obtain the effect of suppression of an increase in the leak current, where the ratio of the composition of Bi is 1-x, and the ratio of the composition of La or Nd is x. It is sufficient that these dopants are added in a precursor solution.

In addition, in the first to third embodiments, the semiconductor memory device 1 as a non-volatile memory is configured of the n-channel MFIS FET. However, the invention is not limited thereto. For example, the semiconductor memory device 1 may be configured with the use of a p-channel MFIS FET. In the case of the p-channel, the carrier moving in the channel region 2 becomes the hole having positive electric charges. On this account, in the case in which the orientation of magnetization of the multiferroic film 9 is the same, the orientation of the Lorentz force working on the hole is opposite to the orientation of the Lorentz force working on the electrons. In addition, because the mobility of the electrons is higher than that of the hole, the n-channel MFIS FET is suited to the high speed operation more than the p-channel MIFIS FET is.

In addition, in the semiconductor memory device 1 according to the first to third embodiments, in the multiferroic film 9, the orientation of the magnetization M is changed based on the orientation of the dielectric polarization P. However, the invention is not limited thereto. For example, for the material for forming the multiferroic film 9, such a material may be used that the direction of the magnetization M is not inverted and only the magnitude of the magnetization M is varied based on the orientation of the dielectric polarization P. In this case, a variation in the current Ir between the source and the drain, or a variation in the voltage ΔV between the data read electrodes 66 and 68 can be detected depending on the magnitude of the magnetization M. Thus, the semiconductor memory device 1 can determine whether stored data is data "1" or data "0", and the same advantages as those of the first to third embodiments can be obtained.

In addition, in the semiconductor memory device 1 according to the second and third embodiments, in the state in which no inversion layer is formed in the channel region 2, it can be considered that the data read electrode 66, the data read electrode 68, the source region 3, and the drain region 4 are insulated to each other. However, the invention is not limited thereto. For example, the source region 3 may be electrically connected to any one of the data read electrodes 66 and 68. Alternatively, the drain region 4 may be electrically connected to any one of the data read electrodes 66 and 68. Also in this case, the same advantages as those of the first to third embodiments can be obtained.

In addition, in the semiconductor memory device 1 according to the second and third embodiments, the length of the data read electrodes 66 and 68 in the X-axis direction is formed almost the same length as the channel length of the channel region 2. However, the invention is not limited thereto. For example, such a scheme may be possible that the length of the data read electrodes 66 and 68 is formed in the length a half of the channel length of the channel region 2 in the X-axis direction and at least one of the data read electrodes 66 and 68 is arranged close to the drain region 4. The electrons receive the Lorentz force from the magnetic field while moving in the channel region 2. On this account, in the second embodiment, the electrons are greatly bent in the channel length direction of the channel region 2 (the Y-axis direction) as the electrons come closer to the drain region 4, and in the third embodiment, the electrons are greatly bent in the thickness direction of the semiconductor substrate 22 (the Z-axis direction). Thus, the density (carrier density) of the electrons in the channel region 2 near the data read electrodes 66 and 68 is greater on the drain region 4 side than that on the source region 3 side. Therefore, at least one of the data read electrodes 66 and 68 is arranged closer to the drain region 4, and then the Hall voltage generated in the channel region 2 can be sufficiently detected.

The semiconductor memory device 1 according to the first to third embodiments uses the p-type silicon semiconductor substrate 22. However, the invention is not limited thereto. For example, such a scheme may be possible that the channel region 2, the source region 3, and the drain region 4 are formed in the front surface area including a semiconductor on the substrate, the data read electrodes 66 and 68 are formed therein as necessary, and the multiferroic film 9 is formed thereon to configure the semiconductor memory device 1. For example, for the front surface area formed of a semiconductor, a SOI (Silicon on Insulator) substrate may be used. Also in this case, the same advantages as those of the first to third embodiments can be obtained.

In addition, in the embodiment, the multiferroic film 9 is used in which the orientation of dielectric polarization and the orientation of magnetization are nearly orthogonal to each other. However, at least in the second and third embodiments, because the orientation of dielectric polarization does not directly contribute to data write and data read, such a multiferroic film 9 may be used in which the orientation of dielectric polarization and the orientation of magnetization are almost in parallel with each other.

What is claimed is:

1. A semiconductor memory device comprising:
   a multiferroic film formed over a semiconductor substrate and having a ferroelectric property and a ferromagnetic property or a ferrimagnetic property;
   a channel region formed below the multiferroic film;
   a source region and a drain region formed on both sides of the channel region;
   a data write electrode for applying a predetermined voltage to the multiferroic film to write data; and
   a data read electrode for reading the data.

2. The semiconductor memory device according to claim 1, wherein a carrier concentration of the channel region is $1 \times 10^{+15}$ cm$^{-3}$ or below.

3. The semiconductor memory device according to claim 1, wherein a magnitude of magnetization of the multiferroic film is 0.1 wb/m$^2$ or above.

4. The semiconductor memory device according to claim 1, wherein the multiferroic film is formed of a material that a dopant of a III group element or a V group element is added to BiFeO$_3$ or BiFeO$_3$, or a material that a dopant is added to BiNi$_x$Mn$_{1-x}$O$_3$ or BiNi$_x$Mn$_{1-x}$O$_3$.

5. A semiconductor memory device comprising:
   a multiferroic film formed over a semiconductor substrate and having a ferroelectric property and a ferromagnetic property or a ferrimagnetic property;
   a channel region formed below the multiferroic film;
   a source region and a drain region formed on both sides of the channel region;
   a data write electrode for applying a predetermined voltage to the multiferroic film to write data in such a way that a magnitude or an orientation of magnetization is changed as corresponding to an orientation of dielectric polarization; and
   a data read electrode for reading the data based on a deviation in a flow of a carrier, the deviation caused by applying a Lorentz force to the carrier flowing in the channel region from a magnetic field occurring in the channel because of the magnetization.

6. The semiconductor memory device according to claim 5, wherein a gate insulating film is formed between the channel region and the multiferroic film.

7. The semiconductor memory device according to claim 5, wherein the data write electrode is a gate electrode formed on the multiferroic film.

8. The semiconductor memory device according to claim 7, wherein the data read electrode detects a change in conductance between the source region and the drain region based on the deviation in the flow of the carrier.

9. The semiconductor memory device according to claim 5, wherein the data write electrode is formed on the source region side and on the drain region side as the multiferroic film is in between.

10. The semiconductor memory device according to claim 9, wherein the data read electrode is formed in a pair to detect a Hall voltage based on the deviation in the flow of the carrier, as the channel region is in between the data read electrodes in a channel width direction.

11. The semiconductor memory device according to claim 10, wherein one of the data read electrodes is arranged deeper in a thickness direction of the semiconductor substrate than the other data read electrodes.

12. The semiconductor memory device according to claim 11, wherein one of the data read electrodes is electrically connected to one of the source region and the drain region.

13. A method of fabricating a semiconductor memory device comprising:
    forming a multiferroic film having a ferroelectric property and a ferromagnetic property or a ferrimagnetic property over a semiconductor substrate;
    forming a source region and a drain region on both sides of a channel region which is formed below the multiferroic film;
    forming a data write electrode that applies a predetermined voltage to the multiferroic film to write data in such a way that a magnitude or an orientation of magnetization is changed as corresponding to an orientation of dielectric polarization; and
    forming a data read electrode that reads the data based on a deviation in a flow of a carrier, the deviation caused by applying a Lorentz force to the carrier flowing in the channel region from a magnetic field occurring in the channel because of the magnetization.

14. The method of fabricating a semiconductor memory device according to claim 13, further comprising, forming a gate insulating film between the channel region and the multiferroic film.

15. The method of fabricating a semiconductor memory device according to claim 13, wherein the data write electrode is a gate electrode formed on the multiferroic film.

16. The method of fabricating a semiconductor memory device according to claim 15, wherein the data read electrode detects a change in conductance between the source region and the drain region based on the deviation in the flow of the carrier.

17. The method of fabricating a semiconductor memory device according to claim 13, wherein the data write electrode is formed on the source region side and on the drain region side as the multiferroic film is in between.

18. The method of fabricating a semiconductor memory device according to claim 17, wherein the data read electrode is formed in a pair to detect a Hall voltage based on the deviation in the flow of the carrier, as the channel region is in between the data read electrodes in a channel width direction.

19. The method of fabricating a semiconductor memory device according to claim 18, wherein one of the data read electrodes is arranged deeper in a thickness direction of the semiconductor substrate than the other data read electrodes.

20. The method of fabricating a semiconductor memory device according to claim 19, wherein one of the data read electrodes is electrically connected to one of the source region and the drain region.

* * * * *